United States Patent [19]

Little et al.

[11] Patent Number: 5,440,187
[45] Date of Patent: Aug. 8, 1995

[54] LONG LIFE RADIOISOTOPE-POWERED, VOLTAIC-JUNCTION BATTERY USING RADIATION RESISTANT MATERIALS

[76] Inventors: Roger G. Little, 228 Dudley Rd., Bedford, Mass. 01730; Edward A. Burke, 11 Indian Hill Rd., Woburn, Mass. 01801

[21] Appl. No.: 146,217

[22] Filed: Nov. 1, 1993

Related U.S. Application Data

[63] Continuation-in-part of Ser. No. 672,872, Mar. 18, 1991, Pat. No. 5,260,621.

[51] Int. Cl.$^6$ .................. G21H 1/00; H01L 31/06; H01L 21/20
[52] U.S. Cl. .................. 310/303; 425/5; 136/202
[58] Field of Search .................. 310/303; 429/5; 136/202, 253

[56] References Cited

U.S. PATENT DOCUMENTS

| | | | |
|---|---|---|---|
| 3,677,825 | 10/1968 | Le Conte Cathey | 136/202 |
| 4,097,654 | 7/1978 | Guazzoni | 429/5 |
| 4,591,654 | 5/1986 | Yamaguchi et al. | 136/252 |
| 4,681,983 | 2/1987 | Markvart et al. | 136/255 |
| 5,260,621 | 11/1993 | Little et al. | 310/303 |

OTHER PUBLICATIONS

Search of "Betavoltaic" for Edward Burke of Spire Corporation dated Nov. 30, 1990.
C. J. Keaveney, V. E. Haven, S. M. Vernon "Emitter Structures in MOCVDINP Solar Cells" *21st IEEE PVSC* May, 1990.
"Neutron Damage in Indium Phosphide" May 4, 1990 Edward A. Burke.
Y. Suzuki, Y. Fukada, Y. Nagashima "An Indium Phosphide Solid State Detector A Possible Low energy gamma and Neutrino Detector" *Nucl. Inst. and Meth. In Phys. Res.* A275 (1989) 142–148.
Masafumi Yamaguchi and Koushi Ando "Mechanism for Radiation Resistance of InP Solar Cells"0 *J. Appl. Phys.* 63(11) Jun. 1, 1988, pp. 5555–5562.
I. Weinberg, C. K. Swartz and R. E. Hart, Jr. "Progress In Indium Phosphide Solar Cell Research" Ninth Space Photovoltaic Research and Technology Conference Apr. 19–21, 1988 pp. 17–26.
Pearsall, Goodbody, Oparaku, Dollery and Hill "Effect of Isotropic Proton Irradiation on the Performance of ITO/InP Solar Cells" 20th IEEE Photovoltaic Specialist Conference vol. II, pp. 898–902.
Coutts and Yamaguchi, "Indium Phosphide–Based Solar Cells: A Critical Review of their Fabrication, Performance and Operation" *Current Topics In Photovoltaics* vol. 3 pp. 79–185, 202–234.
Yamaguchi, Hayashi, Ushirokawa, Takahashi, Koubata, Hashimoto, Okazaki, Takamoto, Ura, Ohmori; Ikegami, Arai, Orii "First Space Flight of InP Solar Cells" 21st IEEE PVSC pp. 1198–1202.
Chandra Goradia and James V. Geier, Weinberg "Modelling and Design of High Efficiency Radiation Tolerant Indium Phosphide Space Solar Cells" 1987 pp. 937–943.
Yamaguchi, Itoh, Ando, Yamamoto "Room-Temperature Annealing Effects on Radiation-Induced Defects in InP Crystals and Solar Cells" *Jap. Journal of App. Phys.* vol. 25, No. 11, Nov. 1986, pp. 1650–1656.

(List continued on next page.)

*Primary Examiner*—Nelson Moskowitz
*Attorney, Agent, or Firm*—Morse, Altman, Dacey & Benson

[57] ABSTRACT

An electric battery comprises: a nuclear source of relatively high energy radiation fluence; a semiconductor junction characterized by a curve for this fluence relating minority carrier diffusion length and a damage constant and; an enclosure having a sufficiently low thermal impedance for dissipation of sufficient heat from the nuclear source to permit predetermined degradation of the minority carrier diffusion length initially and predetermined maintenance of the minority carrier diffusion length thereafter; the nuclear source being a radionuclide selected from the class consisting of alpha, gamma and beta emitters; and the curve being substantially logarithmic.

16 Claims, 4 Drawing Sheets

OTHER PUBLICATIONS

Weinberg, Swartz, Hart, Jr., Yamaguchi "Radiation Damage in Protein Irradiated Indium Phosphide Solar Cells" NASA Technical Memorandum 88835 pp. 1-10 1986.

Weinberg, Swartz, Hart, Jr. "Potential For Use of InP Solar Cells in the Space Radiation Environment" 18th IEEE Photovoltaic Specialists Conference Oct. 21, 1985–Oct. 25, 1985 pp. 1722-1724.

Yamaguchi, Yoshio Itoh, Ando "Room-Temperature Annealing of Radiation-Induced Defects In InP Solar Cells" App. Phys. Lett. 45(11) Dec. 1, 1984 pp. 1206-1208.

Yamaguchi, Uemura, Yamamoto "Radiation Damage in InP Single Crystals and Solar Cells" J. App. Phys. 55(6) Mar. 15, 1984 pp. 1429-1436.

Yamaguchi, Ando, Yamamoto, Uemura "Minority-Carrier Injection Annealing of Electron Irradiation-Induced Defects In InP Solar Cells" App. Phys. Lett. (44) (4) Feb. 15, 1984 pp. 432≧434.

Manasse, Pinajian, Tse "Schottky Barrier Betavoltaic Battery" IEEE Transactions on Nuclear Science vol. NS-23 No. 1, Feb. 1976 pp. 860-870.

Wei "Parametric Studies and Optimization of the Beta-voltaic Cell-II Open-Circuit Voltage and Power Efficiencies" Solid State Electronics 1975 vol 18 pp. 71-77.

Gasper and Fester "Cardiac Pacemaker Power Sources" Proc. Intersociety Energy Conversion Engineering Conference 1975 pp. 1205-1213.

Wei "Parametric Studies and Optimization of the Beta-Voltaic Cell-I, Short-Circuit Current," Solid State Electronics 1974 vol. 17, pp. 1091-1098.

Wei "Optimization of the Beta-Voltaic Cell" 9th Intersociety Energy Conversion Engineering Conference Proceedings 1974 pp. 719-725.

Olsen "Advanced Betavoltaic Power Sources" 9th Intersociety Energy Conversion Engineering Conference Proceedings 1974 pp. 754-762.

Olsen, "Beta Irradiation of Silicon Junction Devices: Effects on Diffusion Length", IEEE Trans. Nucl. Sci. MS-19 Dec. 1972, pp. 375-381.

Hilsum and Rose-Innes *Semiconducting II-V Compounds* 1961 pp. 1-4, 68-88, 196-220.

LONG LIFE RADIOISOTOPE-POWERED, VOLTAIC-JUNCTION BATTERY USING RADIATION RESISTANT MATERIALS

RELATED APPLICATION

The present application is a continuation-in-part of application Ser. No. 07/672,879, filed Mar. 18, 1991, in the names of Roger G. Little and Edward A. Burke, for High Energy Density Nuclide-Emitter, Voltaic-Junction Battery, now U.S. Pat. No. 5,260,621.

BACKGROUND OF THE INVENTION

1. Field of the Invention

The present invention relates to radionuclide-emitter, voltaic-junction batteries, and, more particularly, to compact electric batteries that are powered by the combination of a nuclear radiation emitting source and a responsive semiconductor voltaic-junction for service in many applications where chemical batteries are unsatisfactory or inferior.

2. The Prior Art

Compact long-life energy sources have wide applications in such fields as aerospace systems, cardiac pacemakers, computer memory maintenance, remote instrumentation, etc. Chemical batteries suffer generally from theoretical limits in the energy density that they can accommodate. Radionuclide-emmiter, voltaic-junction cells have much higher theoretical limits in energy density, in some cases more than a factor of 1,000 greater, but, in the past, have not achieved desirable high energy density and long life in practice. Major problems have been encountered in adapting such prior art cells for practical use at relatively low temperature.

Silicon p-n junction cells for directly converting radiation, either visible or ionizing, to electricity were developed in the early 1950's. Specific use of radioisotopes to power silicon p-n cells, known as betavoltaic cells, were extensively studied in the 1970's for applications where low power but high energy density were important, for example, in cardiac pacemakers. A primary motivation for these studies was that the theoretical energy density is much higher in betavoltaic cells than in the best chemical batteries, 24.3 W-h/cm$^3$ versus 0.55 W-h/cm$^3$ for mercury-zinc batteries. Unfortunately, isotopes that could be employed with silicon had to be limited to low energy beta emitters because of radiation damage. For example, a typical threshold energy for electron damage is about 0.180 MeV assuming an atomic displacement damage threshold of 12.9 eV. Alpha particles were known to cause so much damage that they were not seriously considered at any energy. This constraint excluded the most potent nuclide sources, and thus restricted maximum power of such devices because of limits to the specific activity achievable at maximum concentration with reasonable half-lives.

In the aforementioned co-pending patent application of the inventors hereof, the invention is directed to a relatively powerful battery that operates at a temperature above the point at which damage is rectified by annealing in the voltaic-junction. In some applications, particularly some applications involving prosthetic inserts for the human body, batteries that operate at relatively low temperatures are required.

BRIEF DESCRIPTION OF THE INVENTION

The primary object of the present invention is to provide a novel high energy density electric cell comprising a nuclear source of relatively high energy radiation fluence, a semiconductor voltaic-junction characterized by a logarithmic curve for this fluence relating minority carrier diffusion length and a damage constant, and an enclosure having a sufficiently low thermal impedance for dissipation of sufficient heat from the nuclear source to permit predetermined degradation of the minority carrier diffusion length initially and predetermined maintenance of the minority carrier diffusion length thereafter. The nuclear radiation includes energetic radiation such as alpha, beta and gamma emissions or combinations thereof. Preferred inorganic crystalline materials characteristically incorporated in the semiconductor junction are selected from the class consisting of cadmium telluride, indium phosphide, silicon carbide and synthetic diamond. The semiconductor junction, for example, is differentially treated with n or p dopants. The thermal impedance is composed of a thermal insulator such as a ceramic electrical non-conductor. The arrangement is such that damage to the semiconductor junction, resulting from the highly energetic emissions of the nuclear source, at first occurs rapidly and thereafter substantially stabilizes at an operative electrical output for an operative predetermined period.

Other objects of the present invention will in part be obvious and will in part appear hereinafter.

For a fuller understanding of the nature and objects of the present invention, reference is made to the following specification, which is to be taken in connection with the accompanying drawings, wherein:

DETAILED DESCRIPTION OF THE PREFERRED EMBODIMENT

The illustrated electric cell is particularly adapted for biomedical applications where low temperature operation, i.e. at temperatures approximating the temperature of the human body, are desirable. At these temperatures, the nuclide-emmiter, voltaic-junction and thermal impedance housing are interrelated so as to be thermally neutral for an operational period that begins after an initial seasoning period during which cell efficiency stabilizes, and that is designed to continue at predeterminedly acceptable efficiency until the end of the operational period. In contrast to chemical batteries which suffer a precipitous loss of power at end of life, the cell of the present invention suffers precipitous energy loss during the initial seasoning period prior to use and degrades slowly but acceptably thereafter.

The basic reason that high energy cells will provide useful power after significant radiation damage is that the energy density of radio-isotopes is so high relative to chemical systems. The energy density in radio-isotope powered systems can range from 1,000 to 10,000 times that in the best chemical batteries. This means that efficiency can drop to relatively low levels and yet exhibit a lifetime and a power density far exceeding those of ordinary batteries. From a mathematical standpoint, the damage accumulates as the logarithm of the fluence, which means that damage accumulates at an ever decreasing rate as time progresses.

Figure 1:
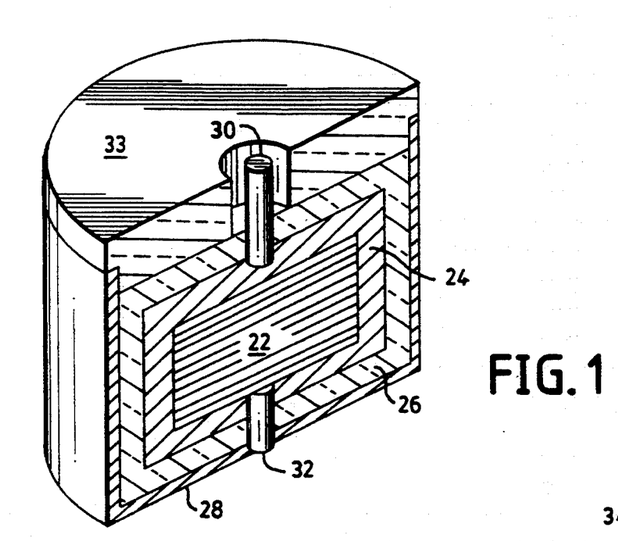
FIG. 1 is an exaggerated cut-away view of a nuclear battery embodying the present invention.
Figure 2:
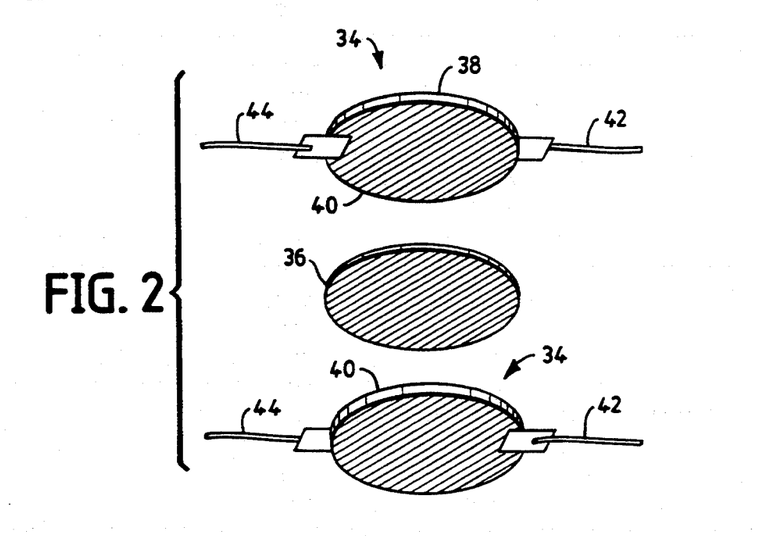
FIG. 2 is an exploded view of a single power cell of the nuclear battery of FIG. 1.
Figure 3:
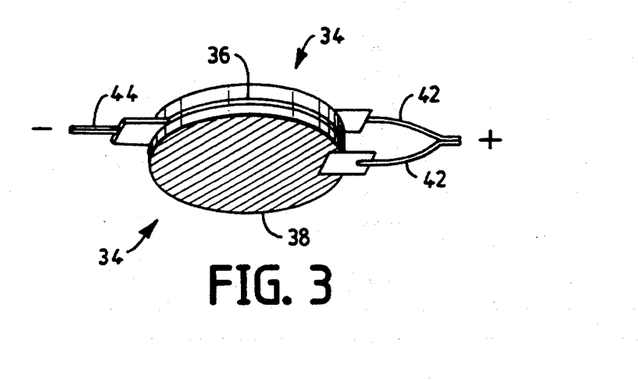
FIG. 3 is an assembled view of the power cell of FIG. 2.

The Embodiment of FIGS. 1 to 3

A preferred embodiment of the present invention is shown in FIG. 1 as comprising a stack 22 of alternate nuclide-emitter and semiconductor-junction strata, an inner heavy metal shield 24 that absorbs nuclear radiation escaping from stack 22, an intermediate low thermal impedance housing 26 that facilitates heat transfer from within stack 22, and an external metal casing 28 that snugly receives housing 26. The electrical output of stack 22 is established across a positive terminal 30 and a negative terminal 32. Negative terminal 32 connects electrically to metal casing 28. Positive terminal 30 projects through an opening in an electrically insulating cap 33 at the top of casing 28.

As shown in FIG. 2, stack 22 is characterized by a sequence of say ten power cells of the type shown in FIGS. 2 and 3. Each power cell includes a pair of semiconductor-junction strata 34 between which is sandwiched a radio-nuclide emitter stratum 36. Each voltaic-junction stratum typically ranges in thickness from 1 to 250 microns. At the lower end of this range, the voltaic-junction stratum, in one form, is deposited on a substrate composed, for example, of silicon. Each nuclide-emitter stratum typically ranges in thickness from 0.1 to 5 microns. The upper thickness limit is determined by undue self-absorption of emitted particles. Each voltaic-junction stratum has an electrically positive face region 38 and an electrically negative face region 40. Positive face region 38 is established by subjection to a p-dopant selected, for example, from the class consisting of zinc and cadmium. Negative face region 40 is established by subjection to an n-dopant selected, for example, from the class consisting of silicon and sulfur. A lead 42 from positive face region 38 and a lead 44 from negative face region 40 connect into the remainder of the electrical system.

The Radionuclide-Emitter

In one form, emitter strata 36 produce alpha particles characterized by a monoenergetic level in excess of 4.5 MeV and ranging upwardly to about 6.5 MeV and ordinarily 5 to 6.1 MeV. In another form, emitter strata 36 produce beta particles having a maximum energy level in excess of 0.01 MeV and ranging upwardly to about 3.0 MeV. Typical compositions of emitter strata 36 are selected from the class consisting of the isotopes listed in the following table, in which $E_{max}$ refers to maximum energy, $E_{avg}$ to average energy, and $T_{\frac{1}{2}}$ to half life:

TABLE I

| Isotope | Type of Emitter (Mev) | Maximum Energy (Mev) | Half Life Years |
|---|---|---|---|
| H³ | β | 0.018 | 12.3 |
| Ni-63 | β | 0.067 | 92.0 |
| Sr-30/Y-90 | β | 0.545/2.26 | 27.7 |
| Pm-147 | β | 0.230 | 2.62 |
| Tl-204 | β | 0.765 | 3.75 |
| Kr-5 | β | 0.670 | 10.9 |
| Cd-113 | β | 0.58 | 14.0 |
| Pu-238 | α | 5.50 | 66.4 |
| Cm-242 | α | 6.10 | 0.45 |
| Cm-244 | α | 5.80 | 18.0 |
| Po-210 | α | 5.30 | .38 |
| Am-241 | α | | |

The Voltaic-Junction

Critical factors in the selection of voltaic-junction materials for a given nuclear radiation source, in accordance with the present invention, are: carrier generation as a function of radiation damage; and cell performance as a function of radiation exposure.

The semiconductor parameter most sensitive to radiation damage is the diffusion length of minority carriers in the base region of a voltaic-junction cell. The sensitivity is quantitatively indicated by a damage constant usually designated $K_L$. The relationship between the diffusion length, L, and this damage constant is given by $$1/L_2 - 1L_o^2 = K_L \cdot \phi$$

Here L is the diffusing length after an exposure to a radiation fluence, $\phi$, $L_o$ is the diffusion length prior to exposure, and $K_L$ is the damage constant.

For reasons that will become apparent below, preferred voltaic-junction materials according to the present invention are selected from the class consisting of cadmium telluride, indium phosphide, silicon carbide and synthetic diamond.

EXAMPLE I

The present invention is specifically illustrated by a configuration of the cell of FIGS. 1, 2 and 3 in which voltaic-junction 34 is an indium phosphide stratum, opposite face regions of which are implanted with (1) zinc ions to establish a p-region and (2) silicon ions to establish an n-region. Each voltaic-junction stratum is approximately 150 microns thick. In one version of this example, emitter stratum is composed of Pu-238. In another version of this example, the emitter stratum is composed of Sr-90. Each emitter stratum is approximately 1.5 microns in thickness. Radiation shielding enclosure 24 is composed of tantalum. Thermal insulating enclosure 26 is composed of ceramic. The thickness and composition of insulating enclosure 26 is selected to maintain the temperature of stack 22 at the temperature of its environment, i.e. about 30° to 40° C. for terrestrial applications in which the cell operates at room or body temperature. The indium phosphide thereby is seasoned by radiation damage initially and maintains a predetermined efficiency for a predetermined operational period thereafter.

Figure 6:
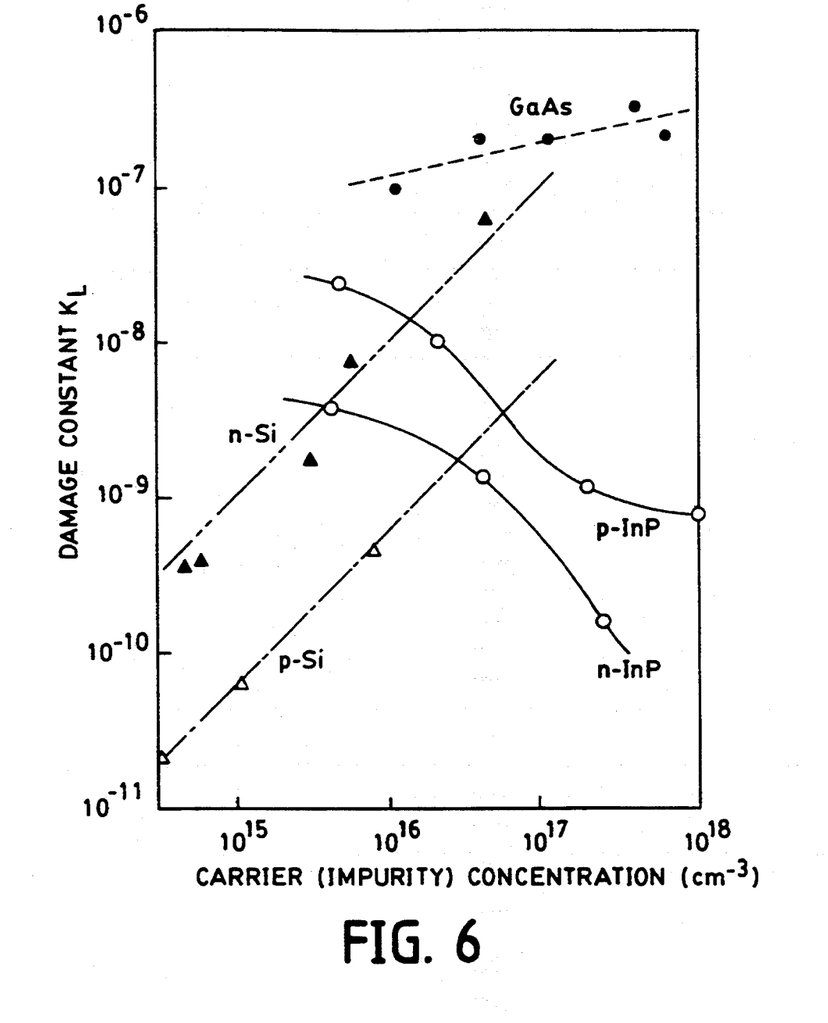
FIG. 6 illustrates a curve of Carrier Concentration versus Damage Constant for a system of present invention

A compilation of damage constants for different semiconductors is given in FIG. 6. This figure was taken from a paper by M. Yamaguchi and K. Ando entitled "Mechanism for Radiation Resistance of InP Solar Cells", J. Appl. Phys. 63, 555 (1988). It is to be noted that at high carrier concentrations, N-type InP has a damage constant about 1,000 times smaller than GaAs.

EXAMPLE II

In this example, cadmium telluride is substituted for indium phosphide as the voltaic-junction semiconductor. Here, according to an article by Woodyard and Landis, entitled, "Radiation of Thin Film Solar Cells for Space Photvoltaic Power," Solar cells, 31, 297 (1991), for electron fluence of $3 \times 10^{16}$ cm$^{-2}$, short circuit current, which is a good indicator of cell damage, indicates a favorable curve of diffusion length versus damage constant.

EXAMPLE III

Figure 5:
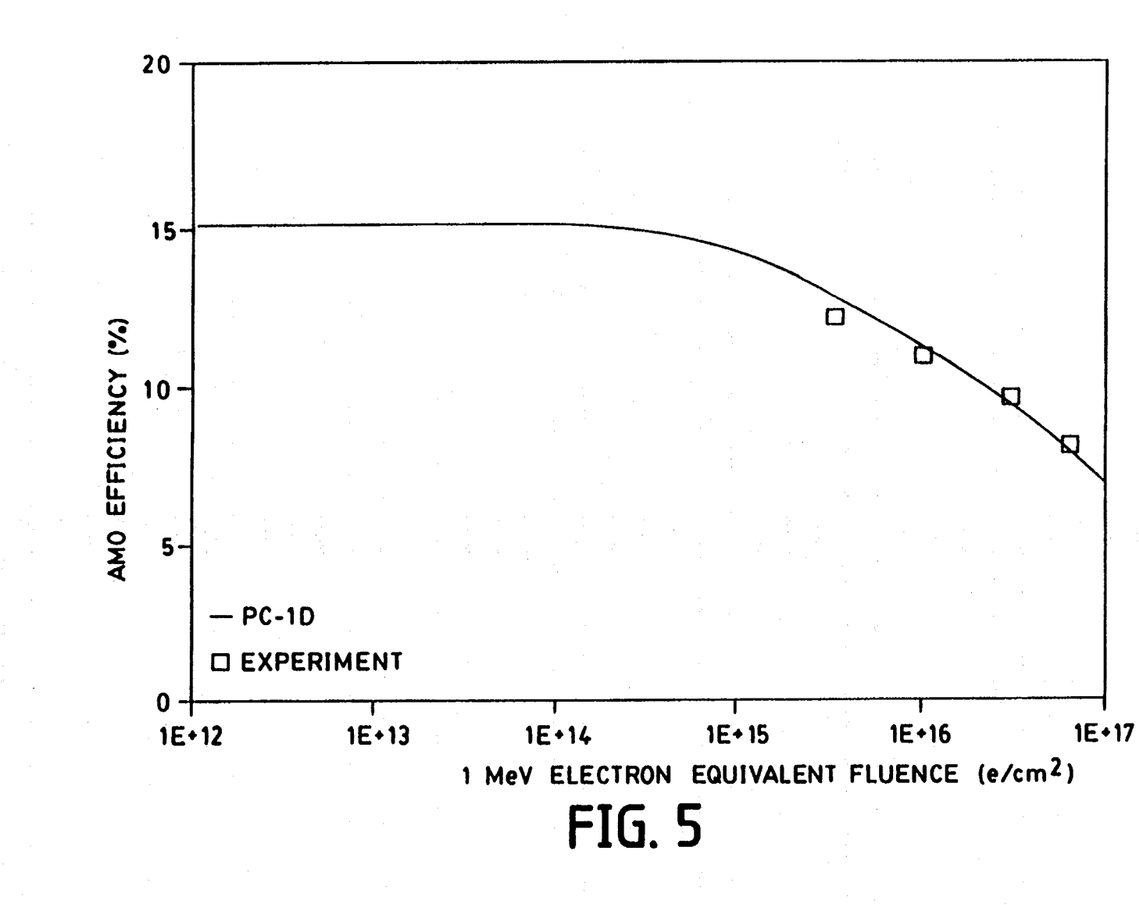
FIG. 5 illustrates a curve of Efficiency versus Fluence for a system of the present invention.

The significance of fluence is indicated in FIG. 5, which shows a radiation result for an InP cell exposed to an alpha fluence equivalent to $10^{17}$ 1 MeV electrons per cm$^2$. It can be seen that the cell has lost about 30% of it initial efficiency at a fluence of $10^{16}$ electrons/cm$^2$. The data points in this figure are experimental and the solid line is a theoretical prediction. This comparison confirms the following calculations for forecasting battery performance.

EXAMPLE IV

These calculations of battery performance employed three basic tools: (1) a Monte Carlo computer program known as TRIM to calculate the carrier generation and radiation damage in a solar cell exposed to alpha radiation, (2) damage correlation theory to transform experimental results on electron damage coefficients to alpha damage coefficients, and (3) a computer device program known well known in the field as PC-1D, which predicts the cell performance as a function of radiation exposure when given diffusion lengths derived from the radiation, e.g. alpha damage coefficients. All of these components of the calculations have been well tested against experimental results over the past few years but have not before been used together in the present manner to forecast radiation damage and radio-isotope powered battery performance.

EXAMPLE V

Figure 4:
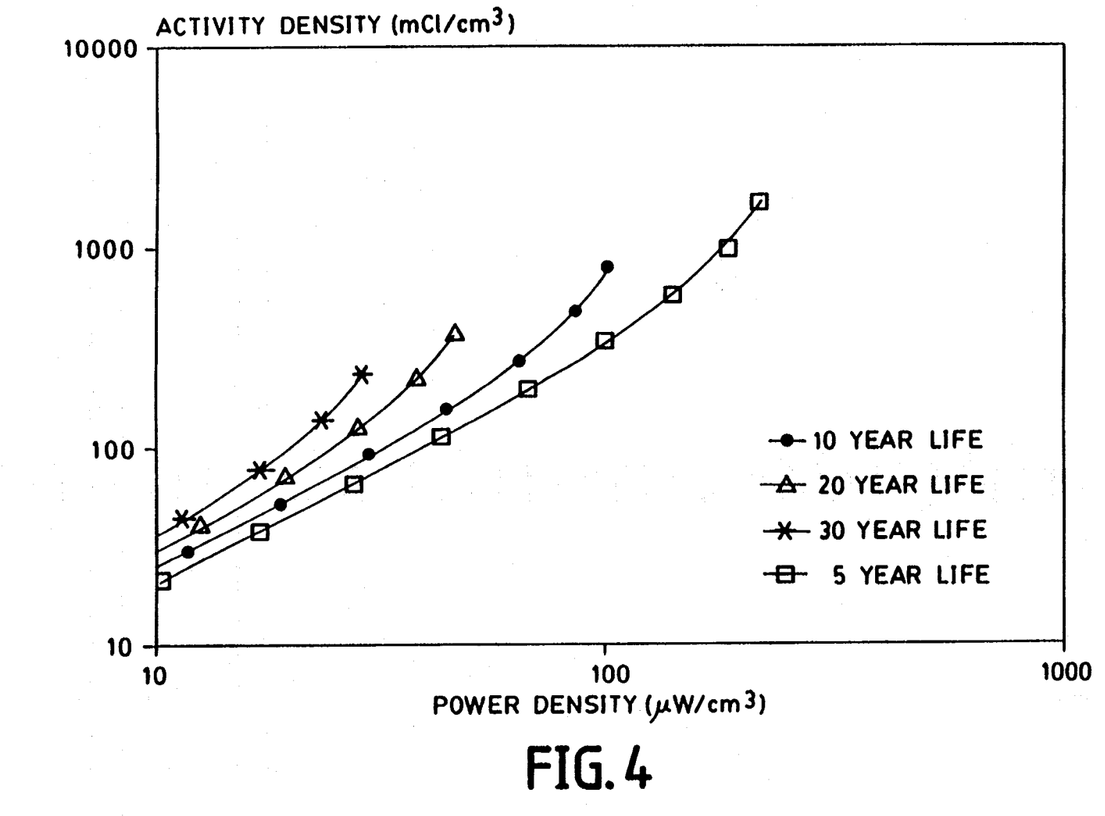
FIG. 4 illustrates curves of Activity Density versus Power Density for a system of the present invention.

Projected performance for a given battery design is a function of power density at the end of a given period of time and the amount of radioactive material needed to achieve it. FIG. 4 is a summary of the computations previously described. Curves are given for the activity density versus power density for 5, 10, 20 and 30 year batteries. The points indicate the relative amount of damage at the end of the design life period. For example, for the battery with a 10 year life, the highest data point occurs at a power density of 100 $\mu$W/cm$^3$ and an active density of 700 mCi/cm$^3$. This highest point means that the battery at the 10 year point is at 5% of its beginning of life power. Each of the points represent a 5% in the fraction of-initial power left. For example the fourth point from the top occurs at about 45 $\mu$W/cm$^3$. A battery designed for this level has 20% of its initial power.

COMPARISON WITH PRIOR ART BATTERIES

Since most previously developed silicon-based beta voltaic cells have used Pm-147, this nuclide serves as a good basis for comparison of prior art batteries with batteries of the present invention. Pm-147 emits beta particles with a peak energy of 0.23 MeV, average energy of 0.063 MeV, and half-life of 2.62 years. Promethium cells generally provide a maximum power of 1000 $\mu$W/cm$^3$ which drops to 266 $\mu$W/cm$^3$ after 5 years. At least 1.5 Ci/cm$^2$ has been required to produce 50 $\mu$W/cm$^2$.

To illustrate the advantage provided by InP, for example, the Pm-147 silicon cell is compared below in Table 2 with other beta isotopes and an alpha emitter. In Table 2, T refers to half-life, $E_{max}$ refers to maximum energy, Ci/cm$^2$ refers to curies per square centimeter, BOL refers to "Beginning Of Life" EOL refers to "End Of Life" W refers to watts and h refers to hours.

TABLE 2

| Isotope | $T_{\frac{1}{2}}$ Years | $E_{max}$ MeV | Activity Ci/cm$^2$ | Output (5 years) | | |
|---|---|---|---|---|---|---|
| | | | | BOL $\mu$W/cm$^3$ | EOL $\mu$W/cm$^3$ | Total W-h/cm$^3$ |
| Pm-147 | 2.62 | 0.230 | 1.50 | 1000 | 266 | 24.3 |
| Tl-204 | 3.75 | 0.765 | 1.05 | 672 | 266 | 19.2 |
| Sr-90 | 27.7 | 0.545 | 0.19 | 301 | 266 | 13.3 |
| Pu-238 | 86.4 | 5.5 | 0.004 | 276 | 266 | 11.9 |

The activity level for each of the above isotopes was adjusted to give the same End Of Life power density as Pm-147. This means that the longer lived isotopes require a much smaller activity level to achieve the same End Of Life power level. We note that total energy output of the Pu-238 powered cell at the end of twenty years is calculated to be 44.7 W-h/cm$^3$ and its power density 235 W-h/cm$^3$. After 20 years, the Pm-147 cell is calculated to generate just 33.0 W-h/cm$^2$ and its power density is calculated to be 5.04 $\mu$Wcm$^3$. Another method of comparison is by lifetimes, assuming that the same average power is produced. Table 3 below compares the power output half-life for different cases, all starting at 1 mW/cm$^3$ and generating an average power of 722 $\mu$W/cm$^3$.

TABLE 3

| | Best Chemical Batteries | |
|---|---|---|
| Hg—Zn | (chemical battery) 0.55 W-h/cm$^3$ | 1 Month |
| | Best Betavoltaic - Si | |
| Pm$^{147}$-Si | 16.6 W-h/cm$^3$ | 2.6 Years |
| | InP at Room Temp | |
| Sr$^{90}$/Y$^{90}$-InP | 182 W-h/cm$^3$ | 28 Years |

LOGARITHMIC CURVE CONSIDERATIONS

It is to be noted that, even following the initial drop in efficiency during seasoning, the higher energy output of Sr-90 is far superior to previous configurations based on Si junctions, even ignoring emissions of the daughter nuclide, Y-90, which would also contribute. The number of curies required to provide a given power level is directly related to lifetime and inversely related to average energy of the emitted particles.

Thus:
for Pm-147, the activity is 1.5 Ci/cm$^2$;
for Sr-90, the activity is 0.63 Ci/cm$^2$; and
for Pu-238, the activity is 0.017 Ci/cm$^2$.

It is found that damage effectiveness of electrons drops rapidly with energy below 1 MeV and, for a pure Sr-90 beta spectrum, is estimated to be 1.2% of that for 1 MeV electrons. Tests have established that $10^{16}$/cm$^2$ of 1 MeV electrons reduce InP cell efficiency to 80% of its initial value at room temperature. Considering the spread of energies in a Sr-90 beta spectrum, there is a requirement for an exposure of $10^{18}$ Sr-90 beta particles to produce the same effect as a 1 MeV electron beam.

For 0.667 curies/cm$^2$ of Sr-90 and again neglecting the daughter emissions, approximately $2.47 \times 10^{10}$ electrons/cm²/sec penetrate one face of the InP stratum. Since activity is sandwiched between two cells, actual curies/cm² is 1.33 Ci, from which $2.47 \times 10^{10}$/sec follows. Exposure time required to reach a fluence of $10^{18}$ is estimated at $4.05 \times 10^7$ seconds, $1.125 \times 10^4$ hours, or 1.28 years. An electron beam of 10 μA/cm2 delivers a fluence of $10^{16}$/cm² in 2.67 minutes so that test irradiation takes no longer than an hour.

Efficiency of isotope powered cells is the fraction of particle energy converted to electrical energy. For Pm-147 powered silicon cells, it has been found that $5.55 \times 10^{10}$ beta particles per square centimeter per second yields a power output of 25 W/cm². For Pm-147 beta particles with an average energy of 0.0625 MeV, the input power is 555 μW/cm². The total efficiency achieved in this case is 4.5%. The theoretical efficiency achievable has been calculated as greater than 10%.

High energy particles, such as alpha particles from Pu-238, will displace atoms from their normal bound positions in a crystalline semiconductor such as indium phosphide. The number of atoms displaced depends upon the energy and mass of the incident particle, the mass of the target atoms, and the minimum energy required to remove it from its bound lattice position. A displaced atom can have considerable recoil energy immediately after being struck by the incident particles. The excess energy is dissipated by ionizing and displacing adjacent atoms in the crystal lattice until the primary recoil energy has dropped to thermal energies (0.025 eV at room temperature). The end result is a number of vacant lattice sites (vacancies) and displaced atoms in interstitual positions in the lattice (interstitials).

At room temperature (300° K.) the vacancies and interstitials are mobile, and diffuse through the crystal lattice until they interact with other defects or lattice impurities, or reach the surface, or annihilate. Many of the complex defects that result from these interactions are stable at room temperature and introduce energy levels throughout the forbidden gap of the semiconductor. The defect energy levels can reduce the lifetime of minority carriers, the majority carrier concentration, and the mobility of the majority carriers. All of these properties have a major impact on the operation of a device.

OPERATION

The nuclide-emitter, voltaic-junction and thermal impedance housing are interrelated so as to be thermally neutral for an operational period. This operational period begins after an initial seasoning period during which cell efficiency stabilizes. Throughout this operational period the cell efficiency continues at predeterminedly acceptable levels. The energy density of the selected radio-isotopes is so high that overall efficiency can drop to relatively low levels and still exhibit a lifetime and a power density far exceeding those of ordinary batteries. From a mathematical standpoint, the damage accumulates as the logarithm of the fluence, which means that damage accumulates at an ever decreasing rate as time progresses.

What is claimed is:

1. An electric battery comprising:
   (a) a nuclear source of relatively high energy radiation fluence;
   (b) a semiconductor junction characterized by a curve for said fluence relating minority carrier diffusion length and a damage constant and;
   (c) an enclosure having a sufficiently low thermal impedance for dissipation of sufficient heat from the nuclear source to permit predetermined degradation of said minority carrier diffusion length initially and predetermined maintenance of said minority carrier diffusion length thereafter;
   (d) said nuclear source being a radionuclide selected from the class consisting of alpha, gamma and beta emitters;
   (e) said curve being substantially logarithmic.

2. The electric battery of claim 1 wherein said semiconductor junction is characterized by an annealing temperature and an operating temperature lower than said annealing temperature.

3. The electric battery of claim 1 wherein said semiconductor junction includes as its characteristic ingredient a member of the class consisting of cadmium telluride, indium phosphide, silicon carbide and synthetic diamond.

4. The electric battery of claim 1 wherein the normal operating temperature within said thermal impedance enclosure is no greater than 40° C.

5. The electric battery of claim 1 wherein said semiconductor-junction is a stratum, one surface of which is characterized by a p-dopant and the other surface of which is characterized by an n-dopant.

6. The electric battery of claim 5 wherein said p-dopant is selected from the class consisting of zinc and cadmium, and said n-dopant is selected from the class consisting of silicon and sulfur.

7. The electric battery of claim 1 wherein said semiconductor junction contains indium phosphide.

8. An electric battery comprising:
   (a) a stack of power cells including radionuclide emitter strata and voltaic junction strata;
   (b) a semiconductor junction characterized by a curve for said fluence relating minority carrier diffusion length and a damage constant and;
   (c) an enclosure having a sufficiently low thermal impedance for dissipation of sufficient heat from the nuclear source to permit predetermined degradation of said minority carrier diffusion length initially and predetermined maintenance of said minority carrier diffusion length thereafter;
   (d) said nuclear source being a radionuclide selected from the class consisting of alpha, gamma and beta emitters;
   (e) said curve being substantially logarithmic.
   (f) said semiconductor junction strata being characterized at their opposite surfaces by p-regions and n-regions, positive conductor terminals being operatively connected to said p-regions, negative conductor terminals being operatively connected to said n-regions;
   (g) said positive conductor terminals and said negative conductor terminals being accessible externally of said thermal impedance enclosure;
   (h) said semiconductor junction being characterized by radiation semiconductor threshold;
   (i) said nuclear source being a radionuclide selected from the class consisting of alpha, beta, and gamma emitters;
   (j) said nuclear source being a radionuclide having a relatively high energy above said radiation damage threshold;
   (k) said normal operating temperature within said thermal impedance enclosure is being less than as said predetermined annealing temperature.

9. The electric battery of claim 8, wherein said nuclear source is a an alpha emitter.

10. The electric battery of claim 8 wherein said nuclear source is a beta emitter.

11. The electric battery of claim 8 wherein said source is a gamma emitter.

12. The electric battery of claim 8 wherein said semiconductor junction includes as its characteristic ingredient a member of the class consisting of cadmium telluride, indium phosphide, silicon carbide and synthetic diamond.

13. The electric battery of claim 8 wherein the normal operating temperature within said thermal impedance enclosure is no greater than 40° C.

14. The electric battery of claim 8 wherein said semiconductor strata have opposed faces characterized by a p-dopant and an n-dopant.

15. The electric battery of claim 15 wherein said said p-dopant is selected from the class consisting of zinc and cadmium, and said n-dopant is selected from the class consisting of silicon and sulfur.

16. The electric battery of claim 8 wherein said semiconductor junction contains indium phosphide as its characteristic ingredient.

* * * * *